(12) United States Patent
Kim et al.

(10) Patent No.: US 10,319,440 B1
(45) Date of Patent: Jun. 11, 2019

(54) VOID CONTROL OF CONFINED PHASE CHANGE MEMORY

(71) Applicant: International Business Machines Corporation, Armonk, NY (US)

(72) Inventors: Wanki Kim, Chappaqua, NY (US); Chung Hon Lam, Peekskill, NY (US); Yu Zhu, Rye Brook, NY (US); Yujun Xie, New Haven, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/937,176

(22) Filed: Mar. 27, 2018

(51) Int. Cl.
  *G11C 11/00* (2006.01)
  *G11C 13/00* (2006.01)
  *H01L 45/00* (2006.01)
  *H01L 21/66* (2006.01)

(52) U.S. Cl.
  CPC ...... *G11C 13/0069* (2013.01); *G11C 13/0004* (2013.01); *H01L 22/20* (2013.01); *H01L 45/06* (2013.01); *H01L 45/124* (2013.01); *H01L 45/1641* (2013.01); *G11C 2013/0078* (2013.01)

(58) Field of Classification Search
  CPC . G11C 11/00; G11C 13/0069; G11C 13/0004; H01L 22/20; H01L 45/06
  USPC ........................................................ 365/163
  See application file for complete search history.

(56) References Cited

U.S. PATENT DOCUMENTS

| | | | |
|---|---|---|---|
| 7,269,080 B2 | 9/2007 | Bedeschi et al. | |
| 8,017,433 B2 | 9/2011 | Lam et al. | |
| 8,809,828 B2 | 8/2014 | Breitwisch et al. | |
| 8,895,953 B1 | 11/2014 | Shields et al. | |
| 8,921,820 B2 | 12/2014 | Brightsky et al. | |
| 8,946,073 B2 | 2/2015 | Brightsky et al. | |
| 9,166,161 B2 | 10/2015 | Brightsky et al. | |
| 9,397,143 B2 | 7/2016 | Rocklein et al. | |
| 9,559,107 B2 | 1/2017 | Briggs et al. | |
| 2008/0232160 A1* | 9/2008 | Gopalakrishnan | G11C 13/0007 365/163 |

(Continued)

OTHER PUBLICATIONS

Kim et al., "Optimization of Programming Current on Endurance of Phase Change Memory," VLSI-TSA, IEEE, 2012, 2 pages.

*Primary Examiner* — Harry W Byrne
(74) *Attorney, Agent, or Firm* — Amin, Turocy & Watson, LLP

(57) ABSTRACT

Techniques for void reduction in phase change memory (PCM) devices are provided. In one embodiment, the system is provided that comprises a PCM device comprising a first electrode and a second electrode. The system can further comprise a first connector coupled to the first electrode and that applies a negative voltage to the first electrode, and a second connector coupled to the second electrode and that applies a ground voltage to the second electrode, wherein applying the negative voltage to the first electrode and applying the ground voltage to the second electrode comprises negatively biasing the PCM device. The system can further comprise the first connector applying the positive voltage to the first electrode, and the second connector applying a ground voltage to the second electrode, wherein applying the positive voltage to the first electrode and applying the ground voltage to the second electrode comprises positively biasing the PCM device.

8 Claims, 11 Drawing Sheets

(56) References Cited

U.S. PATENT DOCUMENTS

| | | | |
|---|---|---|---|
| 2008/0304307 A1* | 12/2008 | Gopalakrishnan | ............................ G11C 13/0004 365/51 |
| 2010/0103718 A1* | 4/2010 | Asao | ................... G11C 11/1659 365/148 |
| 2010/0238711 A1* | 9/2010 | Asao | ........................ G11C 8/14 365/148 |
| 2011/0141801 A1* | 6/2011 | Gopalakrishnan | ............................ G11C 13/0004 365/163 |
| 2011/0317472 A1* | 12/2011 | Awaya | ............... G11C 13/0069 365/148 |
| 2012/0008367 A1* | 1/2012 | Kajiyama | ............. H01L 27/228 365/148 |
| 2012/0320658 A1* | 12/2012 | Wang | ................ G11C 14/0054 365/148 |
| 2014/0036570 A1* | 2/2014 | Lee | .................... G11C 13/0004 365/148 |
| 2015/0179706 A1 | 6/2015 | Rocklein et al. | |
| 2016/0343721 A1 | 11/2016 | Briggs et al. | |
| 2016/0343723 A1 | 11/2016 | Briggs et al. | |

\* cited by examiner

VOID CONTROL OF CONFINED PHASE CHANGE MEMORY

BACKGROUND

The subject disclosure relates to semiconductor devices, and more specifically, a void control of confined phase change memory (PCM).

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, PCM devices are described.

According to an embodiment, a system is provided. In one example, the system comprises a PCM device comprising a first electrode and a second electrode. In one or more implementations, the system can further comprise: a first connector coupled to the first electrode and that applies a negative voltage to the first electrode, and a second connector coupled to the second electrode and that applies a ground voltage to the second electrode, wherein application of the negative voltage to the first electrode and application of the ground voltage to the second electrode results in a negative bias of the PCM device. In some embodiments, the first connector applies a positive voltage to the first electrode, and the second connector applies the ground voltage to the second electrode, wherein application of the positive voltage to the first electrode and application of the ground voltage to the second electrode results in a positive bias of the PCM device.

In another embodiment, a method is provided. In one example, the method comprises forming a PCM device, the PCM device comprising a first electrode and a second electrode. In one or more examples, the method can further comprise applying a positive voltage to the first electrode. In one or more examples, the method can further comprise applying a ground voltage to the second electrode, wherein applying the positive voltage and applying the ground voltage comprises positively biasing the PCM device.

In another embodiment, a method is provided. In one example, the method comprises forming a PCM device, the PCM device comprising a first electrode, a second electrode, a metallic liner positioned between the first electrode and the second electrode, and a phase change material in an interior of the metallic liner. In one or more examples, the method can further comprise applying a negative voltage to the first electrode, and applying a ground voltage to the second electrode, wherein applying the negative voltage to the first electrode and applying the ground voltage to the second electrode comprises negatively biasing the PCM device. In one or more examples, the method can further comprise applying the positive voltage to the first electrode, and applying a ground voltage to the second electrode, wherein applying the positive voltage to the first electrode and applying the ground voltage to the second electrode comprises positively biasing the PCM device.

DETAILED DESCRIPTION

Figure 1:
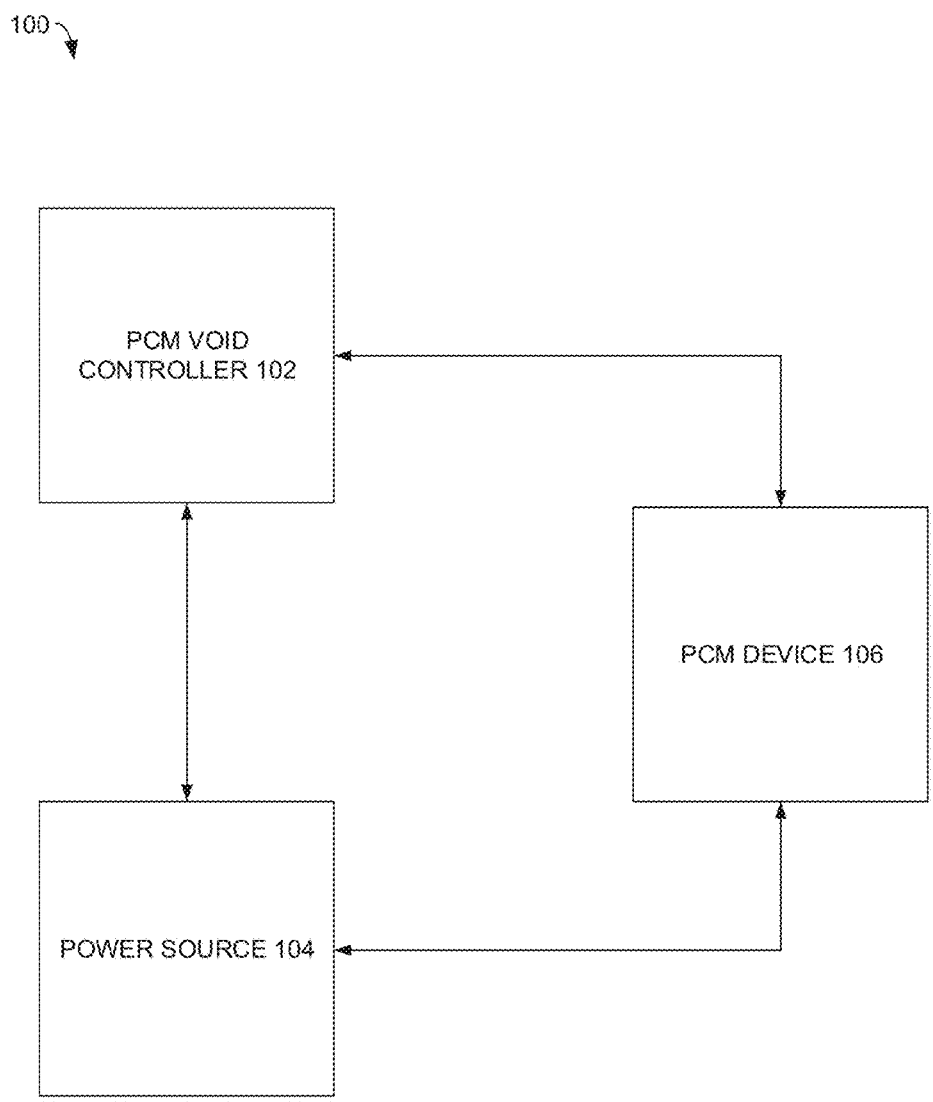
FIG. 1 illustrates an example, non-limiting system in which a void of a PCM device can be controlled in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A PCM device is generally a type of computer memory device—that is, a type of non-volatile random access memory (RAM). A PCM device generally comprises two electrodes coupled to a chemical compound (which can be referred to a as phase change material), where a state of the chemical compound can be modified to store data. For example, the phase change material can comprise $Ge_xSb_yTe_z$ (GST).

Common operations on a PCM device can include RESET, SET, and reading the stored data. A RESET operation can involve applying an electrical current to a PCM device to melt its chemical compound, where the melted chemical compound then cools into an amorphous phase. A SET operation can involve applying an electrical current to a PCM device to heat its chemical compound above a crystallization point of the chemical compound (where a crystallization point can be a lower temperature than a melting point), where the chemical compound then cools into a crystalline phase. These SET and RESET operations can collectively be referred to as programming a PCM device. Then, reading data that is stored in a PCM device can comprise applying a low-current pulse to the PCM device, and determining a resistance of the PCM device (where the resistance can identify the data being stored).

A problem with some PCM devices is that a PCM device can exhibit a void formation, or open failure, which can lead to a failure of the PCM device. As a PCM device is used, a volume change of the PCM device during programming leads to void formation. As described herein, void formation can be mitigated against through bipolar switching and bias programming. For example, where a void is positioned at a first electrode of a PCM device, this void can be reduced or eliminated by negatively biasing the PCM device (i.e., applying a negative bias to the first electrode while applying a ground voltage to the second electrode, or applying a ground voltage to the first electrode while applying a positive voltage to the second electrode). And, where a void is positioned at the second electrode of a PCM device, this void can be reduced or eliminated by positively biasing the PCM device (i.e., applying a positive voltage to the first electrode while applying a ground voltage to the second electrode, or applying a ground voltage to the first electrode while applying a negative voltage to the second electrode).

It can be appreciated that, while use of a ground voltage is generally described herein, that this is by way of example. That is, there can be examples where a PCM device is positively biased by applying a positive voltage to the second electrode of the PCM device, and then applying a larger positive voltage to the first electrode of that PCM device, creating a positive voltage potential.

FIG. 1 illustrates an example, non-limiting system in which a void of a PCM device can be controlled. System 100 comprises PCM void controller 102, power source 104, and PCM device 106. In some examples, PCM void controller 102 can be a computer system implemented using aspects of operating environment 1100 of FIG. 11, and can control the flow of electricity from power source 104 to PCM device 106 to negatively or positively bias PCM device 106, and thus reduce or eliminate a void present in PCM device 106. Power source 104 is a source of electricity, and the output of electricity from power source 104 can be selectively controlled by PCM void controller 102. PCM device 106 can be implemented with PCM device 200 of FIG. 2.

Figure 2:
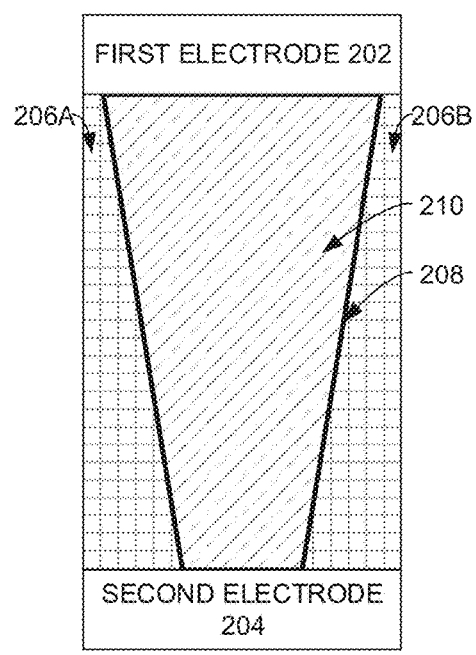
FIG. 2 illustrates an example, non-limiting PCM device that can have a void controlled by the system of FIG. 1 in accordance with one or more embodiments described herein.

FIG. 2 illustrates an example, non-limiting PCM device that can have a void controlled by the system of FIG. 1. PCM device 200 comprises first electrode 202, second electrode 204, dielectric 206A, dielectric 206B, metallic liner 208, and phase change material 210. In some examples, a first electrode and a second electrode can be referred to as a top electrode and a bottom electrode, respectively. It can be appreciated that the view of PCM device 200 provided is a cross-sectional side view of PCM device 200. Thus, while dielectric 206A and dielectric 206B appear to be separated in this cross-sectional side view, in some embodiments, dielectric can fully surround the sides of metallic liner 208, such that dielectric 206A and dielectric 206B connect with each other.

As depicted, phase change material 210 has a larger area of contact with first electrode 202 than metallic liner 208 has with second electrode 204. It can be appreciated that a cavity like this in which metallic liner 208 and phase change material 210 can be placed can be formed from the top down from dielectric 206A and dielectric 206B, and that certain manufacturing processes can result in such a shape. It can further be appreciated that there can be embodiments where this cavity has a different shape, such as a cavity with more vertical, or strictly vertical, walls.

Figure 3:
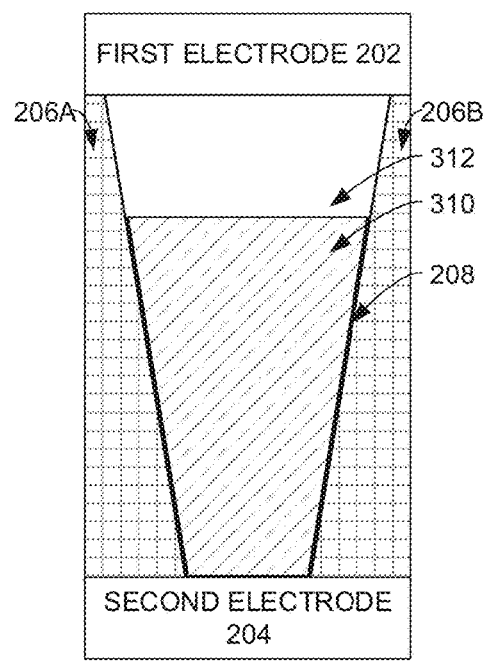
FIG. 3 illustrates the example, non-limiting PCM device of FIG. 2 with a top void in accordance with one or more embodiments described herein.

FIG. 3 illustrates the example, non-limiting PCM device of FIG. 2 with a top void. PCM device 300 can be considered to have a top void, because top void 312 is in a position that is touching first electrode 202. Then, phase change material 310 is phase change material that fills the remainder of the interior space of metallic liner 208 that is not occupied by top void 312. A PCM device with a top void can have its void reduced by negative-bias programming according to techniques described herein.

Figure 4:
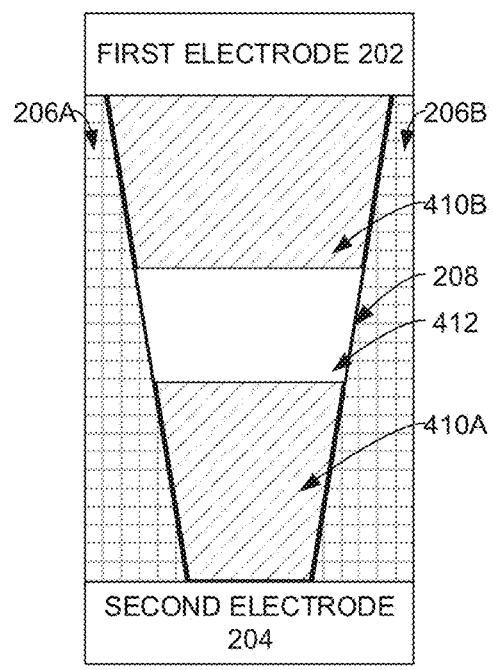
FIG. 4 illustrates the example, non-limiting PCM device of FIG. 2 with a middle void in accordance with one or more embodiments described herein.

FIG. 4 illustrates the example, non-limiting PCM device of FIG. 2 with a middle void. PCM device 400 can be considered to have a middle void, because middle void 412 is in a position that is neither touching first electrode 202 nor touching second electrode 204. Then, phase change material 410 is phase change material that fills the remainder of the interior space of metallic liner 208 that is not occupied by middle void 412. A PCM device with a middle void can have its void reduced according to techniques described herein.

Figure 5:
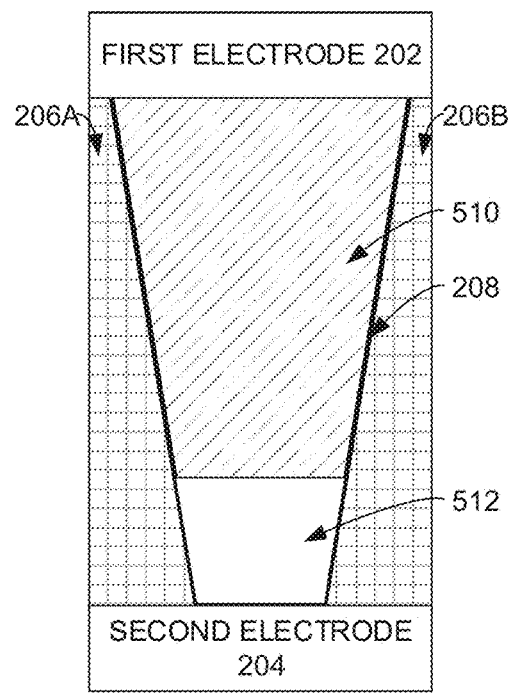
FIG. 5 illustrates the example, non-limiting PCM device of FIG. 2 with a bottom void in accordance with one or more embodiments described herein.

FIG. 5 illustrates the example, non-limiting PCM device of FIG. 2 with a bottom void. PCM device 500 can be considered to have a bottom void, because bottom void 512 is in a position that is touching second electrode 204. Then, phase change material 510 is phase change material that fills the remainder of the interior space of metallic liner 208 that is not occupied by bottom void 512. A PCM device with a bottom void can have its void reduced by positive-bias programming according to techniques described herein.

Figure 6:
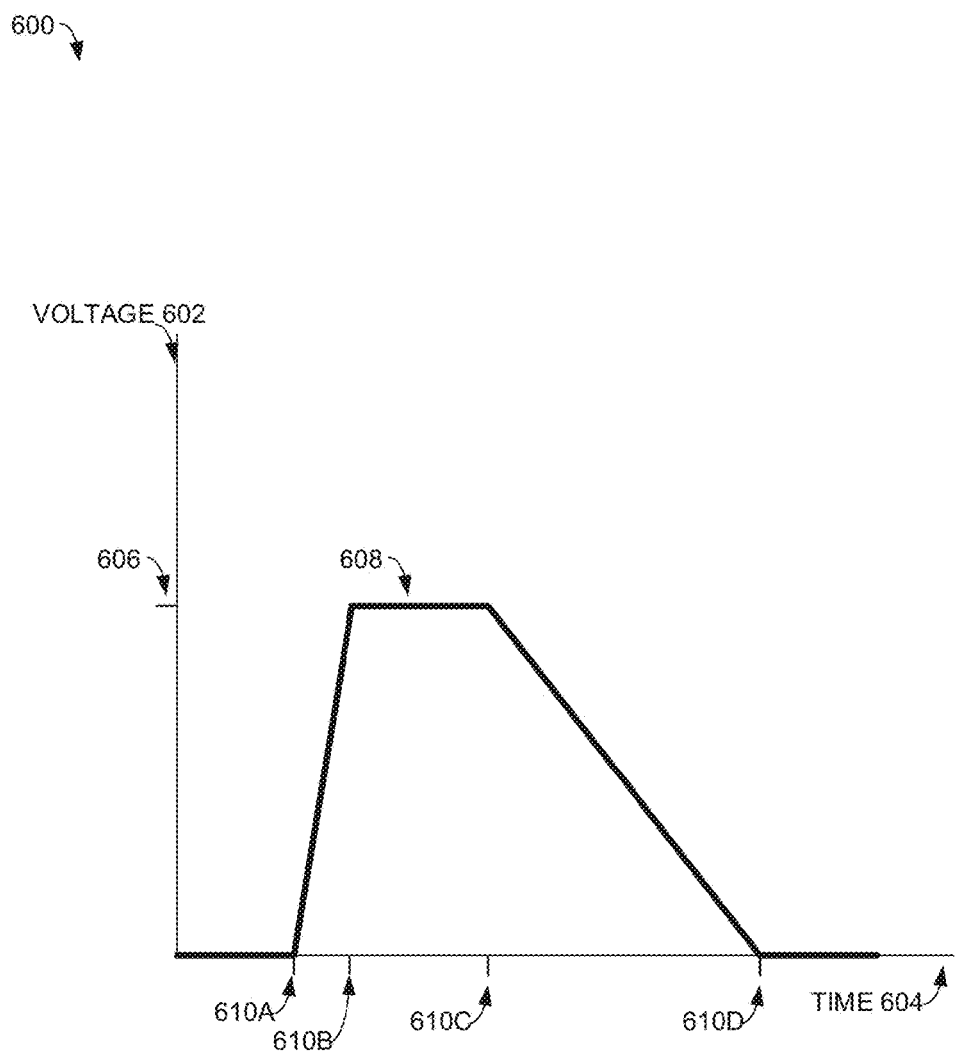
FIG. 6 illustrates an example, non-limiting graph of a voltage pulse that can be utilized to SET the PCM device of FIG. 2 in accordance with one or more embodiments described herein.

FIG. 6 illustrates an example, non-limiting graph of a voltage pulse that can be utilized to SET the PCM device of FIG. 2. Graph 600 plots a voltage 602 over time 604, and this is graphed as line 608. Line 608 peaks as voltage 606 (which can be seen as a lower peak voltage than peak voltage 706 in FIG. 7, which involves a RESET of a PCM device). Additionally, as depicted, line 608 changes at several points in time.

As depicted, the total time over which a non-zero voltage is applied—from time 610A to time 610D is 1,285 nanoseconds (ns). The voltage is ramped up from zero (or ground) to peak voltage 606 between time 610A and time 610B, which as depicted lasts 100 ns. Then, peak voltage 606 is maintained from time 610B to time 610C, which lasts 185 ns (so the time between time 610A and time 610C is 285 ns). Then, the voltage is reduced from peak voltage 606 to zero (or ground) from time 610C to time 610D, which lasts 1 microsecond (µs).

A ground voltage is described herein. It can be appreciated that there can be examples where this ground voltage is nonzero, but still a voltage potential is created between peak voltage 606 and a ground voltage. Furthermore, it can be appreciated that graph 600 (involving a PCM device SET) and graph 700 (involving a PCM device RESET) depict applying a positive voltage pulse. While a positive voltage pulse can be used in positively biasing a PCM device, as described herein, it can be appreciated that a similar negative voltage pulse can be used in negatively biasing a PCM device, as described herein.

Figure 7:
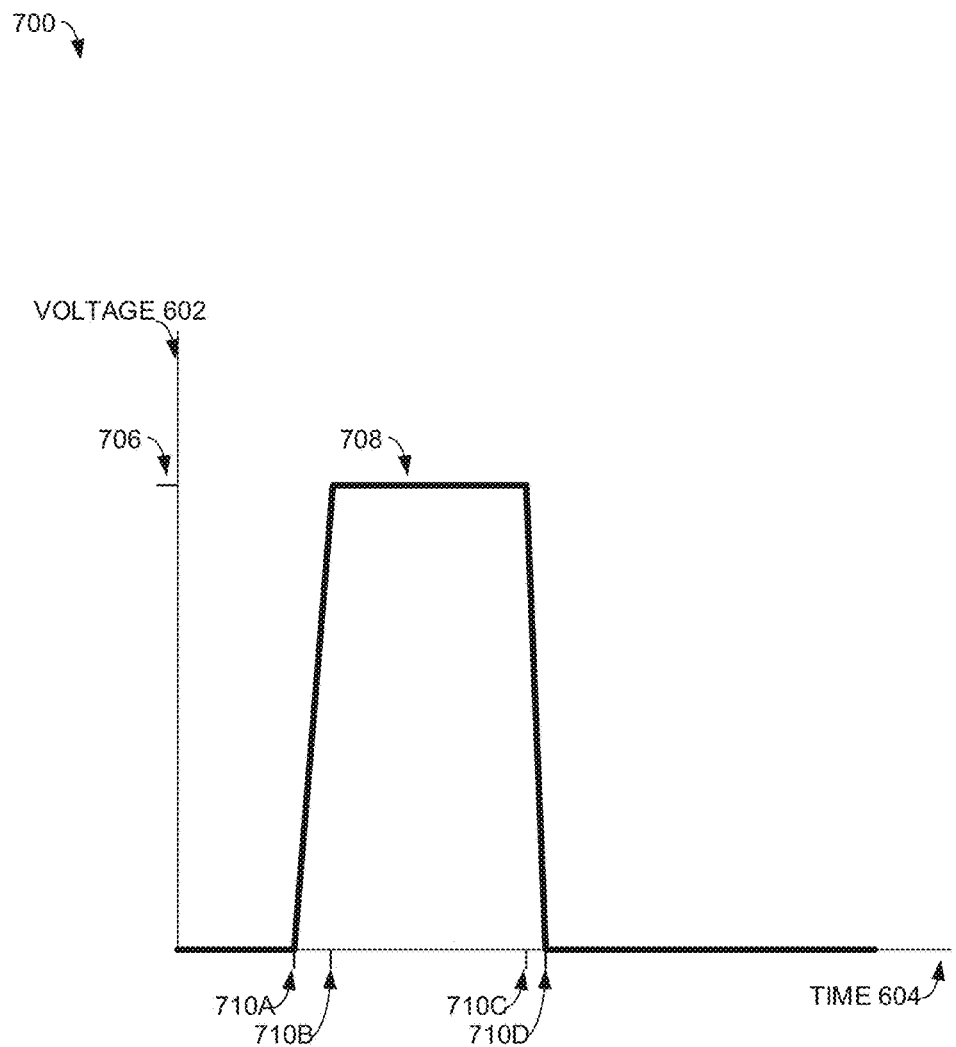
FIG. 7 illustrates an example, non-limiting graph of a voltage pulse that can be utilized to RESET the PCM device of FIG. 2 in accordance with one or more embodiments described herein.

These times depicted in FIG. 6 can be seen in comparison to similar changes in line 708 of FIG. 7, which involves a PCM device RESET. In general, a PCM device SET can involve a lower peak voltage, with a voltage applied over a longer time period as compared to a PCM device RESET.

It can be appreciated that these time periods and voltages depicted in graph 600 are an example of times and voltages, and that there can be other time periods and voltages applied in a PCM device SET.

FIG. 7 illustrates an example, non-limiting graph of a voltage pulse that can be utilized to RESET the PCM device of FIG. 2. Similar to graph 600, graph 700 plots a voltage 602 over time 604, and this is graphed as line 708. Line 708 peaks as voltage 706 (which can be seen as a higher peak voltage than peak voltage 606 in FIG. 6, which involves a PCM device SET as opposed to this RESET). Additionally, as depicted, line 708 changes at several points in time.

As depicted, the total time over which a non-zero voltage is applied—from time 710A to time 710D is 42 ns. The voltage is ramped up from zero (or ground) to peak voltage 706 between time 710A and time 710B, which as depicted lasts 19 ns. Then, peak voltage 706 is maintained from time 710B to time 710C, which lasts 21 ns (so the time between time 710A and time 710C is 40 ns). Then, the voltage is reduced from peak voltage 706 to zero (or ground) from time 710C to time 710D, which lasts 2 ns.

These times depicted in FIG. 7 can be seen in comparison to similar changes in line 608 of FIG. 7, which involves a PCM device SET, as opposed to this RESET. In general, a PCM device RESET involves a higher peak voltage, with a voltage applied over a shorter time period as compared to a PCM device SET.

It can be appreciated that these time periods and voltages depicted in graph 700 are an example of times and voltages, and that there can be other time periods and voltages applied in a PCM device RESET.

Figure 8:
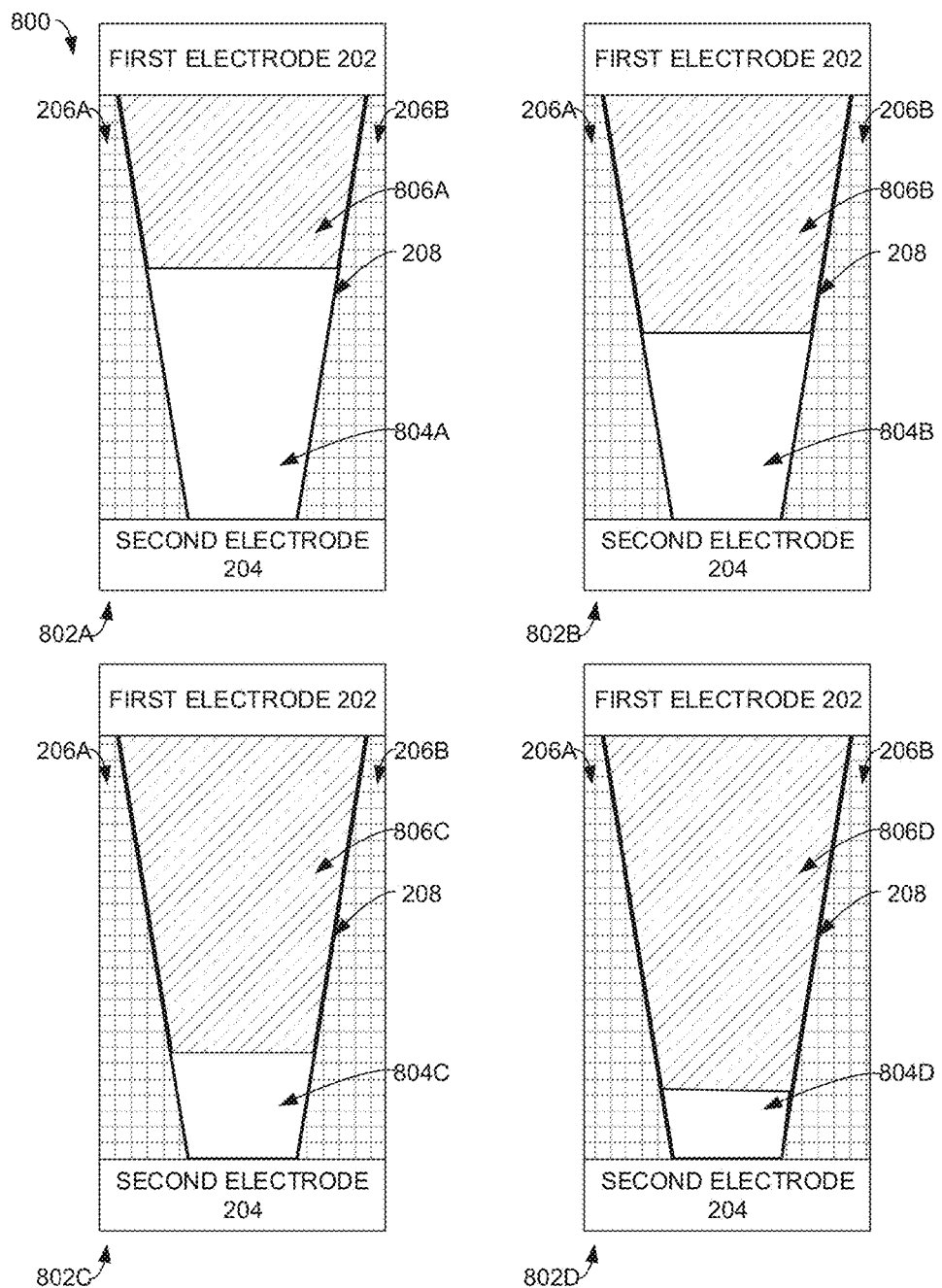
FIG. 8 illustrates an example, non-limiting PCM device as its void is reduced through applying voltage pulses in accordance with one or more embodiments described herein.

FIG. 8 illustrates an example, non-limiting PCM device as its bottom void is reduced through positive-bias programming PCM devices 800 represent a PCM device over time as its void is reduced according to techniques described herein. While PCM devices 800 depicts the reduction of a bottom void, it can be appreciated that approaches to reducing a top void or a middle void can be used in a similar manner.

PCM devices 800 represents one PCM device at four points in time—first PCM device 802A, then PCM device 802B, then PCM device 802C, then PCM device 802D. Between each of these points in time, techniques for reducing a bottom void have been implemented on the PCM device, and the void in PCM device has been reduced.

In PCM device 802A, void 804A is relatively large as compared to the voids in the other PCMs. Then, the amount of phase change material 806A is inversely proportional to the size of void 804A, since the void and the phase change material combine to fill the pore surrounded by metallic liner 208. Then, after one or more RESETS have been applied to PCM device 802A, PCM device 802B is seen. In PCM device 802B, void 804B is smaller than void 804A, and then phase change material 806B has increased in size because of the reduced size of void 804B.

After one or more RESETS have been applied to PCM device 802B, PCM device 802C is then seen. In PCM device 802C, void 804C is smaller than void 804B, and then phase change material 806C has increased in size because of the reduced size of void 804C. Finally, PCM device 802D is seen, and is produced as a result of applying one or more resets to PCM device 802C. In PCM device 802D, void 804D is smaller than void 804C, and then phase change material 806D has increased in size because of the reduced size of void 804D.

It can be appreciated that, as the void is reduced in size from void 804A through void 804D, the void remains in contact with second electrode 204. There can be other examples where a void is reduced in size by removing some of the void from a position other than that which is furthest from the associated electrode. Additionally, in some examples, a void can be eliminated, and in other examples, a void can be suitably reduced in size.

Figure 9:
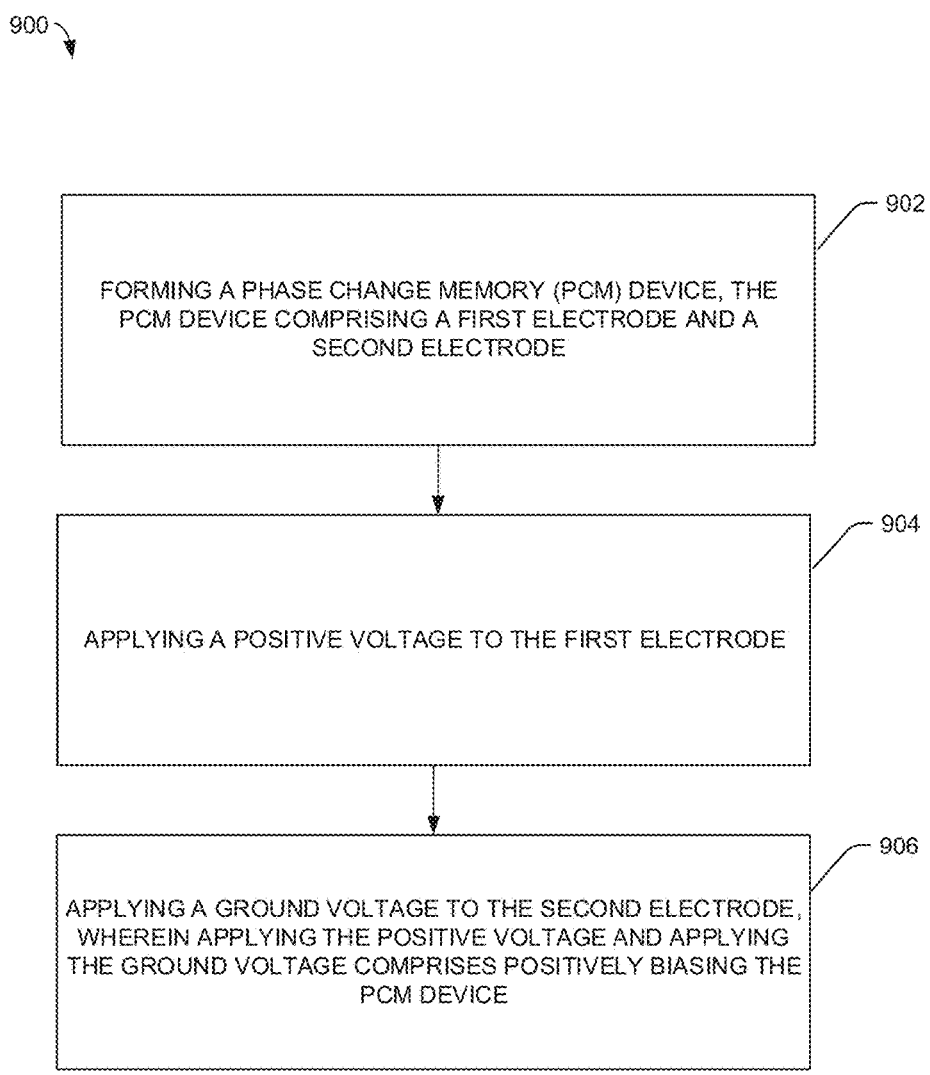
FIG. 9 illustrates a flow diagram of an example, non-limiting computer-implemented method that facilitates controlling a void in a PCM device in accordance with one or more embodiments described herein.

FIG. 9 illustrates a flow diagram of an example, non-limiting computer-implemented method that facilitates controlling a void in a PCM device in accordance with one or more embodiments described herein. In some examples, flow diagram 900 can be implemented by operating environment 1100. It can be appreciated that the operations of flow diagram 900 can be implemented in a different order than is depicted. It can also be appreciated that the operations of flow diagram 900 can be implemented in a different order than is depicted.

Figure 10:
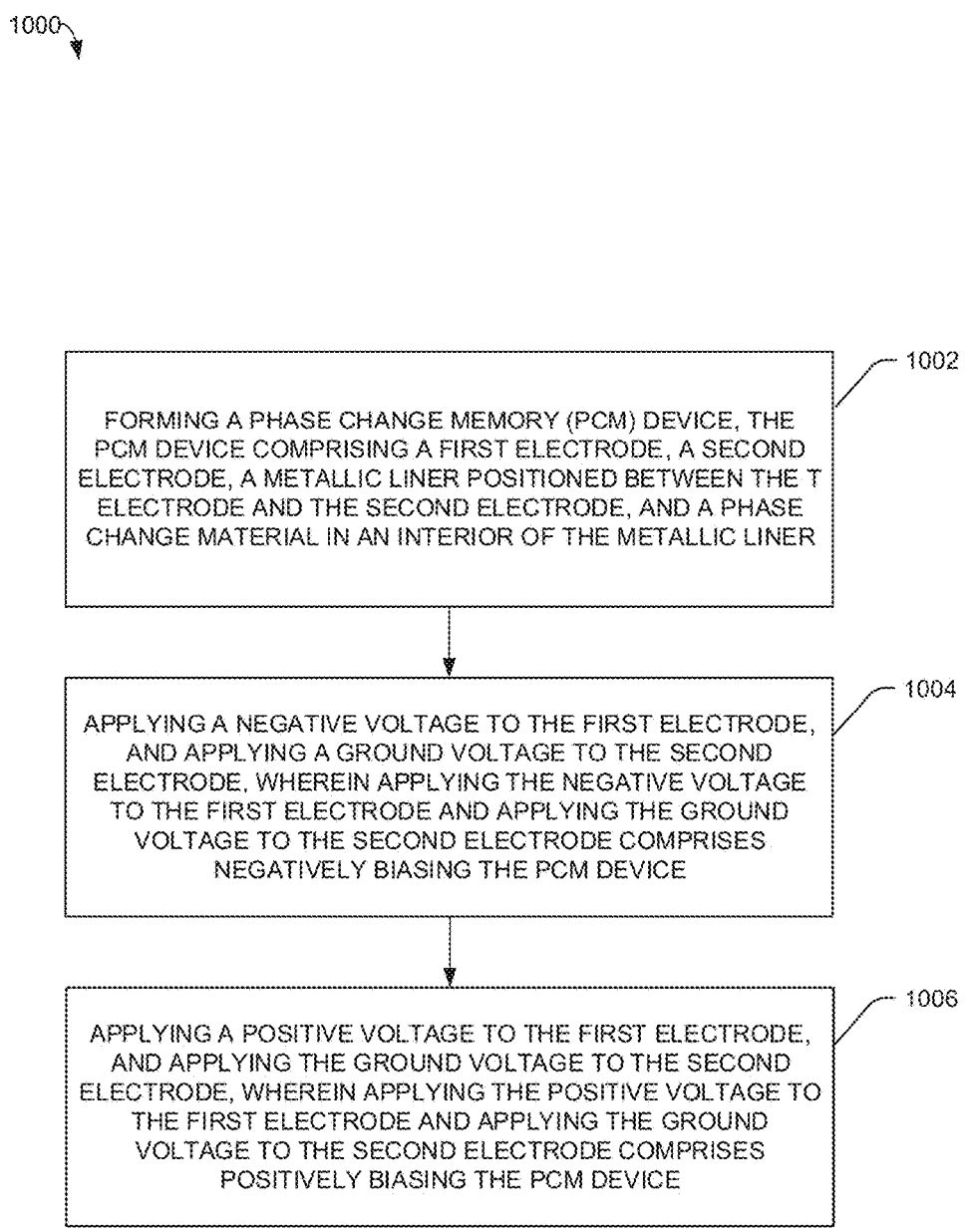
FIG. 10 illustrates another flow diagram of an example, non-limiting computer-implemented method that facilitates controlling a void in a PCM device in accordance with one or more embodiments described herein.

In non-limiting example embodiments, a computing device (or system) (e.g., computer 1112) is provided comprising one or more processors and one or more memories that stores executable instructions that, when executed by the one or more processors, can facilitate performance of the operations as described herein, including the non-limiting methods as illustrated in the flow diagrams of FIG. 10. As a non-limiting example, the one or more processors can facilitate performance of the methods by directing or controlling one or more equipment operable to perform PCM device void reduction.

Operation 902 depicts forming (e.g., computer 1112) a PCM device, the PCM device comprising a first electrode and a second electrode. In some examples, this PCM device can be PCM device 200, the first electrode can be first electrode 202, and the second electrode can be second electrode 204.

In some examples, operation 902 also comprises positioning a metallic liner between the first electrode and the second electrode, and wherein the metallic liner is coupled to an exterior surface of a phase change material (e.g. GST compound) of the PCM device. In some examples, the metallic liner surrounds the phase change material (e.g. GST compound). In some examples, the metallic liner can be metallic liner 208, and the phase change material can be phase change material 210.

In some examples, the metallic liner has a constant electrical resistance. In some examples, the phase change material has a variable electrical resistance. This electrical resistance of the phase change material can vary based on the states of phase change material (e.g. GST compound).

In some examples, operation 902 also comprises coupling (e.g., computer 1112) a dielectric to an exterior surface of the metallic liner. In some examples, the dielectric can be a combination of dielectric 206A and dielectric 206B.

Operation 904 depicts, applying (e.g., by computer 1112) a positive voltage to the first electrode. Operation 906 depicts applying (e.g., by computer 1112) a ground voltage to the second electrode, wherein applying the positive voltage and applying the ground voltage comprises positively biasing the PCM device. In such examples, PCM void controller 102 can direct power source 104 to apply a positive voltage to a first electrode or a second electrode of PCM device 106.

In some examples, operations 904 and 906 can be implemented in response to determining that there is a void present at or near the first electrode of the PCM device. As used herein, a void "near" another electrode (first electrode or second electrode) can be a void located within a distance approximately equal to half of the pore height. Take the example of system 100. In system 100, PCM void controller 102 can perform one or more operations to determine one or more of whether a void exists in PCM device 106; a size of the void in PCM device 106; and an electrical resistance associated with a phase change material that contains the void in PCM device 106. For example, PCM void controller 102 can perform transmission electron microscopy (TEM) analysis imaging to take an image of a PCM device along with a possible void in the PCM device, and then perform computer-based image analysis on this image to determine whether a void exists in the PCM device, and, if so, where.

In some examples, a ground voltage can be applied to the second electrode, as seen in system 100. In such examples, PCM void controller 102 can direct power source 104 to apply a ground voltage to a second electrode of PCM device 106 (and where PCM device 106 is implemented with PCM device 200, this second electrode can be second electrode 204). The combination of applying a positive voltage to a first electrode of a PCM device and a ground voltage to a second electrode of the PCM device can comprise positively biasing the PCM device.

In some examples, operations 904 and 906 can include negatively biasing the PCM device. For example, where it is determined that the phase change material has a void positioned at the first electrode (which can be first electrode 202 of PCM device 200, and which can be determined as a result of TEM imaging, as described above), it can be determined that negatively biasing the PCM device is likely to reduce a size of the void. In such cases, then a negative voltage can be applied to the first electrode (e.g., first electrode 202), and a ground voltage can be applied to the second electrode (e.g., second electrode 204). This combination of applying the negative voltage and applying the ground voltage can comprise negatively biasing the PCM device.

A way that the negative voltage and the ground voltage can be applied to a PCM device can be seen by way of the example of system 100. In such an example, PCM void controller 102 can direct power source 104 both to apply a negative voltage to a first electrode of PCM device 106 (where PCM device 106 is implemented with PCM device 200, this first electrode can be first electrode 202), and to apply a ground voltage to a second electrode of PCM device 106 (where PCM device 106 is implemented with PCM device 200, this second electrode can be second electrode 204).

In some examples, operation 906 comprises heating (e.g. by computer 1112) a portion of the phase change material by positively or negatively biasing (e.g., computer 1112) the PCM device. Similarly, in some examples, operation 906 comprises biasing (e.g. by computer 1112) the PCM device by heating a portion of the phase change material via an electrical current that corresponds to the positive voltage or the negative voltage. That is, as the positive voltage (or the negative voltage) and the ground voltage are applied to their respective electrodes, electrical current can flow through the PCM device, including through the metallic liner and/or the phase change material. As this electrical current flows, the phase change material can be heated from the electrical current (since the phase change material and/or the metallic liner can provide an electrical resistance that turns electrical current into heat energy).

FIG. 10 illustrates another flow diagram of an example, non-limiting computer-implemented method that facilitates controlling a void in a PCM device in accordance with one or more embodiments described herein. In some examples, flow diagram 1000 can be implemented by operating environment 1100. It can be appreciated that the operations of flow diagram 1000 can be implemented in a different order than is depicted. It can also be appreciated that the operations of flow diagram 1000 can be implemented in a different order than is depicted.

In non-limiting example embodiments, a computing device (or system) (e.g., computer 1112) is provided comprising one or more processors and one or more memories that stores executable instructions that, when executed by the one or more processors, can facilitate performance of the operations as described herein, including the non-limiting methods as illustrated in the flow diagrams of FIG. 10. As a non-limiting example, the one or more processors can facilitate performance of the methods by directing or controlling one or more equipment operable to perform PCM device void reduction.

Operation 1002 depicts forming (e.g., by computer 1112) a PCM device, the PCM device comprising a first electrode, a second electrode, a metallic liner positioned between the first electrode and the second electrode, and a phase change material in an interior of the metallic liner. In some examples, this PCM device can be PCM device 200. In such examples, then the first electrode can be first electrode 202, the second electrode can be second electrode 204, the phase change material can be phase change material 210, and the metallic liner can be metallic liner 208.

In some examples, the metallic liner has a constant electrical resistance. In some examples, the phase change material has a variable electrical resistance. This electrical resistance of the phase change material can vary based on its states (e.g., SET state or RESET state).

In some examples, operation 1002 also comprises coupling (or arranging; e.g. by computer 1112) a dielectric to an exterior surface of the metallic liner. In some examples, the dielectric can be a combination of dielectric 206A and dielectric 206B.

Operation 1004 depicts applying (e.g., by computer 1112) a negative voltage to the first electrode, and applying (e.g., by computer 1112) a ground voltage to the second electrode, wherein applying the negative voltage to the first electrode and applying the ground voltage to the second electrode comprises negatively biasing the PCM device.

In some examples, operation 1004 can be implemented in response to determining that the phase change material has a void positioned at the first electrode (which can be first electrode 202 of PCM device 200). Take the example of system 100. In system 100, PCM void controller 102 can perform one or more operations to determine one or more of whether a void exists in PCM device 106; a size of the void in PCM device 106; and an electrical resistance associated with a phase change material that contains the void in PCM device 106. For example, PCM void controller can perform TEM imaging to take an image of a PCM device along with a possible void in the PCM device, and then perform computer-based image analysis on this image to determine whether a void exists in the PCM device, and, if so, where.

As a result, it can be determined that negatively biasing the PCM device is likely to reduce a size of the void near the first electrode 202 (e.g., in some embodiments, a void can be considered to be "near" the first electrode 202 if the void is within a distance of the first electrode 202 that is half of a pore height). In such cases, then a negative voltage can be applied to the first electrode 202 and a ground voltage can be applied to the second electrode 204. This combination of applying the negative voltage and applying the ground voltage can comprise negatively biasing the PCM device.

A way that the negative voltage and the ground voltage can be applied to a PCM device can be seen by way of the example of system 100. In such an example, PCM void controller 102 can direct power source 104 both to apply a negative voltage to a first electrode of PCM device 106 (where PCM device 106 is implemented with PCM device 200, this first electrode can be first electrode 202), and to apply a ground voltage to a second electrode of PCM device 106 (where PCM device 106 is implemented with PCM device 200, this second electrode can be second electrode 204).

Operation 1006 depicts applying (e.g., by computer 1112) the positive voltage to the first electrode, and applying (e.g., by computer 1112) a ground voltage to the second electrode, wherein applying the positive voltage to the first electrode and applying the ground voltage to the second electrode comprises positively biasing the PCM device. In some examples, the first electrode can be first electrode 202 of PCM device 200, and the second electrode can be second electrode 204 of PCM device 200.

In some examples, a positive voltage can be applied to the first electrode as seen in system 100. In such examples, PCM void controller 102 can direct power source 104 to apply a positive voltage to a first electrode of PCM device 106 (and where PCM device 106 is implemented with PCM device 200, this first electrode can be first electrode 202).

In some examples, a ground voltage can be applied to the second electrode as seen in system 100. In such examples, PCM void controller 102 can direct power source 104 to apply a ground voltage to a second electrode of PCM device 106 (and where PCM device 106 is implemented with PCM device 200, this second electrode can be second electrode 204). The combination of applying a positive voltage to a first electrode of a PCM device and a ground voltage to a second electrode of the PCM device can comprise positively biasing the PCM device.

In some examples, operation 1006 can be implemented in response to determining that there is a void present at or near the second electrode of the PCM device. Take the example of system 100. In system 100, PCM void controller 102 can perform one or more operations to determine one or more of whether a void exists in PCM device 106; a size of the void in PCM device 106; and an electrical resistance associated with a phase change material that contains the void in PCM device 106. For example, PCM void controller can perform TEM imaging to take an image of a PCM device along with a possible void in the PCM device, and then perform computer-based image analysis on this image to determine whether a void exists in the PCM device, and, if so, where.

In some examples, operation 1006 comprises heating (e.g. by computer 1112) a portion of the phase change material by positively biasing or negatively biasing the PCM device. Similarly, in some examples, operation 906 comprises biasing (e.g. by computer 1112) the PCM device by heating a portion of the phase change material via an electrical current that corresponds to the positive voltage or the negative voltage. That is, as the positive voltage (or the negative voltage) and the ground voltage are applied to their respective electrodes, electrical current can flow through the PCM device, including through the metallic liner and/or the phase change material. As this electrical current flows, the phase change material can be heated from the electrical current (since the phase change material and/or the metallic liner provide an electrical resistance that turns electrical current into heat energy).

Figure 11:
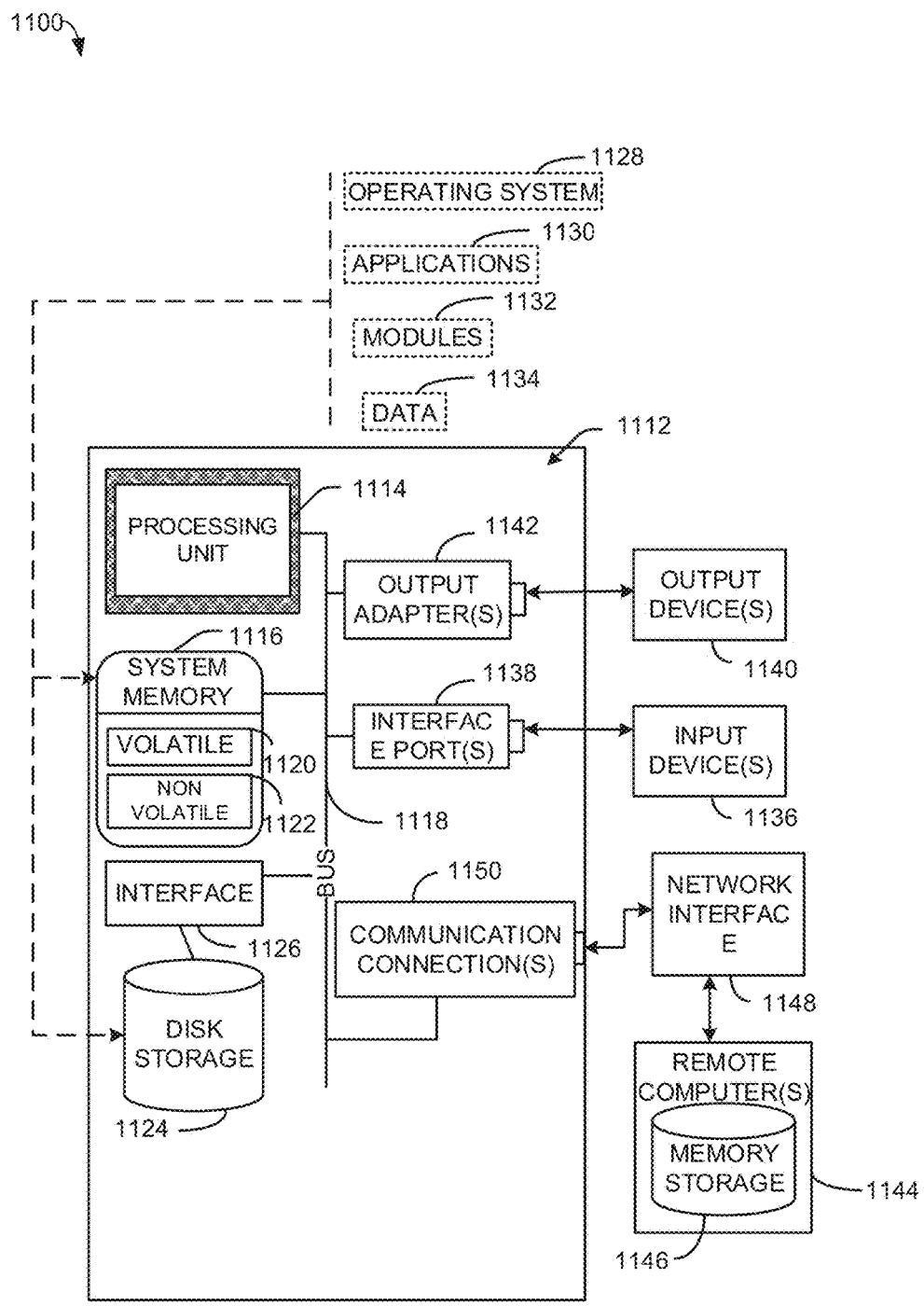
FIG. 11 illustrates a block diagram of an example, non-limiting operating environment in which one or more embodiments described herein can be facilitated.

FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. For example, operating environment 1100 can be used to implement aspects of the example, non-limiting computer-implemented methods that facilitates implementing PCM device void reduction in FIGS. 9 and 10. Additionally, in some examples, a PCM device with void reduction can be utilized to implement one or more aspects of operating environment 1100. For example, a PCM device with void reduction (such as one produced by implementing aspects of the example, non-limiting computer-implemented methods of FIGS. 9 and 10) can be used to implement non-volatile memory 1122. Additionally, operating environment 1100 can be communicatively coupled a system that performs tasks such as forming a PCM device, coupling things together, or TEM imaging, and operating environment 1100 can direct such a system to perform such tasks.

FIG. 11 illustrates a block diagram of an example, non-limiting operating environment in which one or more embodiments described herein can be facilitated. Repetitive description of like elements employed in other embodiments described herein is omitted for sake of brevity. With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112.

System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a phase change memory (PCM) device comprising a first electrode and a second electrode;
    a first connector coupled to the first electrode and that applies a negative voltage to the first electrode, and a second connector coupled to the second electrode and that applies a ground voltage to the second electrode, wherein application of the negative voltage to the first electrode and application of the ground voltage to the second electrode results in a negative bias of the PCM device; and
    the first connector applies a positive voltage to the first electrode, and the second connector applies the ground voltage to the second electrode, wherein application of the positive voltage to the first electrode and application of the ground voltage to the second electrode results in a positive bias of the PCM device.

2. The system of claim 1, wherein the PCM device further comprises a metallic liner positioned between the first electrode and the second electrode, and coupled to an exterior surface of a phase change material of the PCM device.

3. The system of claim 2, wherein the metallic liner has a constant electrical resistance.

4. The system of claim 2, further comprising:
    a dielectric coupled to an exterior surface of the metallic liner.

5. The system of claim 2, wherein the metallic liner surrounds the phase change material.

6. The system of claim 2, wherein the phase change material has a variable electrical resistance.

7. The system of claim 1, wherein the first connector and the second connector negatively bias the PCM device in response to determining that a void is present at or within a defined distance of the first electrode and based on reduction or elimination of the void; and
    wherein the first connector and the second connector positively bias the PCM device in response to determining that a void is present at or within the defined distance of the second electrode and based on reduction or elimination of the void.

8. The system of claim 1, wherein the first connector and the second connector bias the PCM device by heating a portion of the phase change material via an electrical current that corresponds to the positive voltage or the negative voltage.

* * * * *